(12) United States Patent
Oh

(10) Patent No.: US 6,407,427 B1
(45) Date of Patent: Jun. 18, 2002

(54) SOI WAFER DEVICE AND A METHOD OF FABRICATING THE SAME

(75) Inventor: Jeong Hee Oh, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/705,705

(22) Filed: Nov. 6, 2000

(30) Foreign Application Priority Data

Nov. 5, 1999 (KR) .............................. 99-48911

(51) Int. Cl.[7] .............................................. H01L 29/76
(52) U.S. Cl. ...................... 257/347; 257/276; 257/350; 257/299
(58) Field of Search ................. 257/347, 276, 257/299, 350, 351, 371, 372, 375; 438/151, 225, 233, 297, 586; 359/41, 59, 67

(56) References Cited

U.S. PATENT DOCUMENTS

| | | | | |
|---|---|---|---|---|
| 5,008,723 A | * | 4/1991 | van der Have | ............ 357/23.7 |
| 5,444,557 A | * | 8/1995 | Spitzer et al. | ................. 359/59 |
| 5,475,514 A | * | 12/1995 | Salero et al. | .................. 357/41 |
| 6,048,756 A | * | 4/2000 | Lee et al. | .................... 438/151 |
| 6,191,449 B1 | * | 2/2001 | Shino | ......................... 257/347 |
| 6,204,138 B1 | * | 3/2001 | Krishnan et al. | ........... 438/307 |

* cited by examiner

Primary Examiner—Olik Chaudhuri
Assistant Examiner—Laura M Schillinger
(74) Attorney, Agent, or Firm—Pillsbury Winthrop LLP

(57) ABSTRACT

The present invention discloses a SOI device capable of removing a floating body effect and improving a static electricity emission characteristic and a method of fabricating the same. The SOI device according to the present invention, comprising: a base substrate; a buried oxide layer formed to expose a predetermined region of the base substrate on the base substrate; a body contact layer formed to the same thickness as the buried oxide layer on the exposed base substrate region; a body layer of a transistor formed on the buried oxide layer and the body contact layer; a gate having a gate oxide layer formed on the body layer; and a drain region and a source region formed in a depth contacting with the buried oxide in the body layer region at both sides of the gate, the source being in contact with the body contact layer.

7 Claims, 6 Drawing Sheets

SOI WAFER DEVICE AND A METHOD OF FABRICATING THE SAME

BACKGROUND OF THE INVENTION

1. Field of the Invention

The present invention relates to a Silicon-On-Insulator (SOI) device, and more particularly to a SOI device capable of removing a floating body effect and improving a static electricity characteristic and a method of fabricating the same.

2. Description of the Related Art

It is well known that a n-channel MOSFET comprises a p-type body, a n-type gate, and n-type source/drain regions. A p-channel MOSFET comprises a n-type body, a p-type gate, and p-type source/drain regions.

The p-channel and n-channel MOSFETS with such structures have generally been integrated in a single crystal silicon (Si) wafer comprised of bulk Si to form CMOS devices. Recently, progress has been made on a development of a technique for integrating the MOSFETS in a SOI wafer with a stack structure of a base substrate, a buried oxide layer, and a semiconductor layer.

A MOSFET integrated in a SOI wafer, i.e., a SOI device, has the advantages of high speed due to low junction capacitance, low voltage driving due to low threshold voltage, and decreased latch-up due to complete isolation, as compared with a device integrated in a single crystal Si wafer.

The MOSFET integrated in the single crystal Si wafer is easily connected to fixed potentials. Unlike MOSFET devices constructed on the single crystal Si wafer, however, the MOSFET devices integrated in the SOI wafer can experience a floating body effect, such as a kink effect and a parasitic vertical type bipolar operation because its body is not connected to fixed potential and may float from ground. Further, since the electrostatic discharge (hereinafter, "ESD") characteristic is poor, the SOI MOSFET does not tend to operate normally.

When the drain voltage is high in a n-channel MOSFET integrated in a SOI wafer, electrons injected into the channel create an electron-hole pair near the drain, due to impact ionization. Because the created hole moves toward a source, and because the source does not contact a substrate to which a ground is applied, excess holes accumulate in a body part of the substrate, which floats, thereby increasing the potential shift. As a result, the threshold voltage of the transistor is lowered, and a kink effect, characterized by increasing drain current, is generated. Therefore, the n-channel MOSFET integrated in the SOI wafer does not operate normally.

When a lot of holes are generated due to the impact ionization, a bias applied to the body is increased, thereby applying a forward bias to the p-n junction between the source region and the body. Consequently, a source carrier flowing into the body turns on a parasitic NPN bipolar transistor comprising the source region, the body region, and the drain region. This generates a parasitic bell-type bipolar operation this is difficult to control by applying current to the MOSFET gate. As a result, the n-channel MOSFET integrated in the SOI wafer does not operate normally.

Moreover, due to the structural and electrical characteristics of the MOSFET integrated in the SOI wafer, static electricity discharged into such a device is not easily dissipated. ESD discharges, therefore, tend to damage the MOSFET, thereby degrading the device performance.

The problem generated by floating the body of the transistor is conventionally solved by forming a back-gate, forming a body contact structure, and/or forming a device on a complete depletion layer.

FIG. 1 is a cross-sectional view showing a SOI device using a conventional back-gate. As shown, a n-channel MOSFET and a p-channel MOSFET are formed on a semiconductor layer 5 of a SOI wafer having a stack structure of a base substrate 1, a buried oxide layer 2, and the semiconductor layer 5. A p+ well 3 and a n+ well 4 for a back-gate are formed on the base substrate 1.

In such a SOI device, bias voltages $V_{bn}$ and $V_{bp}$ are respectively applied to the p+ well 3 and the n+ well 4 on the back gate formed on the base substrate, respectively to controlling the threshold voltages of the n-channel and the p-channel MOSFETS.

The characteristics of the SOI device using the back-gate are very sensitive to changes or variations in the structure of the back-gate and the method used to fabricate the substrate terminal, the alignment and the resistance of a contacts to which a bias voltage is applied. Consequently, the design and fabrication processes are difficult to control and stabilize.

FIGS. 2A and 2B are plane views showing a body contact SOI device. FIG. 2A shows body contacts 14a–c which are formed at the end of a channel of an n-channel MOSFET 10 comprising an H type gate 11, an n+ type source region 12 and a drain region 13. A charge accumulated on the body is emitted through the body contacts 14a–c, to thereby reduce the floating body effects.

In FIG. 2B, a n-channel MOSFET 20 is shown which comprises a gate 21, a p+ type source region 22, and an n+ type drain region 23. A body contact 24 is connected to a p+ region 25, which is formed on the source region 22, and which contacts with a body of the lower portion of the channel. The n-channel MOSFET 20 having such structure can restrain the floating body effect with a relatively simple structure as compared with the structure of the n-channel MOSFET 10 in FIG. 2A.

The SOI device shown in FIG. 2A has larger area than an equivalent device formed in the single crystal Si wafer. Particularly, in cases where the width of the device region is large, a hole can not easily reach the body contact as a result of the increased resistance of the channel region. Consequently, a kink effect cannot be effectively suppressed.

In addition, in the SOI device shown in FIG. 2B, the source region 22 and the drain region 23 have symmetrical structures, the source region 22 and the drain region 23 are not switched onto each other when the SOI device is operational.

A method of forming a device on a complete depletion layer has a shortcoming that the thickness of the semiconductor layer in the SOI wafer is defined, since the thickness of the semiconductor layer on which the device will be formed, is maintained to less than of a predetermined thickness.

When static electricity current is emitted to one place, heat is generated in the inner circuit due to the concentrated static electricity current, thereby tending to damage the device. Unlike the general bulk Si device in which the static electricity current and the generated heat are easily dissipated through a well, in SOI device in which the source region and the drain regions are in contact with the buried oxide layer, such a dissipation path does not exist. In an effort to solve the poor static electricity characteristics of the SOI device, a peripheral circuit which prevents static electricity from discharging current to a ground well or the source region is used, thereby protecting the inner circuit from the discharge and the resulting damage.

SUMMARY OF THE INVENTION

It is an object of the present invention to provide a SOI device capable of restraining the generation of floating body effects and a method of fabricating the same.

It is another object of the present invention to provide a SOI device capable of improved ESD characteristics and a method of fabricating the same.

To accomplish the aforementioned objects, a SOI device of the present invention, comprising: a base substrate; a buried oxide layer formed on the base substrate but exposing predetermined regions of the base substrate; a body contact layer having the same thickness as the buried oxide layer on the exposed base substrate region; a body layer of a transistor formed on the buried oxide layer and the body contact layer; a gate having a gate oxide layer formed on the body layer; and a drain region and a source region formed in a depth contacting with the buried oxide layer in the body layer region at both sides of the gate, the source region also being in contact with the body contact layer.

A method of fabricating the SOI device of the present invention, comprising: forming a buried oxide layer on a base substrate; etching a predetermined portion of the buried oxide layer to expose the base substrate; forming a body contact layer having the same thickness as the buried oxide layer on the exposed base substrate region; forming a semiconductor layer on the buried oxide layer and the body contact layer; forming a body layer of a transistor contacting with the body contact layer by etching the semiconductor layer; forming a gate electrode having a gate oxide layer on the body layer; and forming a drain region and a source region in a depth contacting with the buried oxide layer in the body layer region at both sides of the gate electrode, the source region also being in contact with the body layer.

BRIEF DESCRIPTION OF THE INVENTION

The objects and advantages of the present invention can be further understood with reference to the following detailed description and the attached drawings.

DETAILED DESCRIPTION OF THE INVENTION

Figure 1:
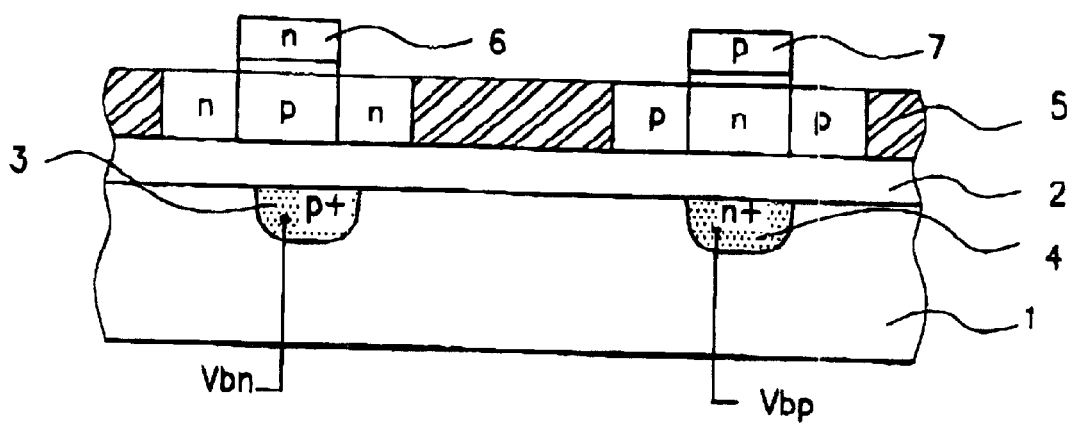
FIG. 1 is a cross-sectional view of a SOI device using a conventional back-gate.
Figure 2A:
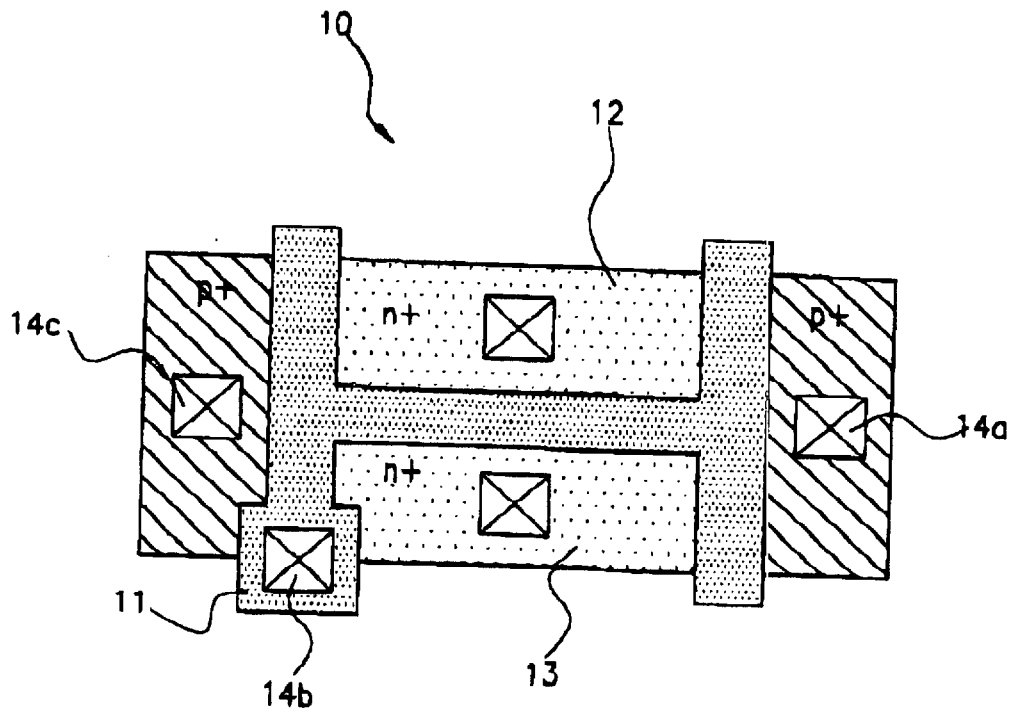
FIGS. 2A and 2B are plane views of a SOI device using a conventional body contact.
Figure 2B:
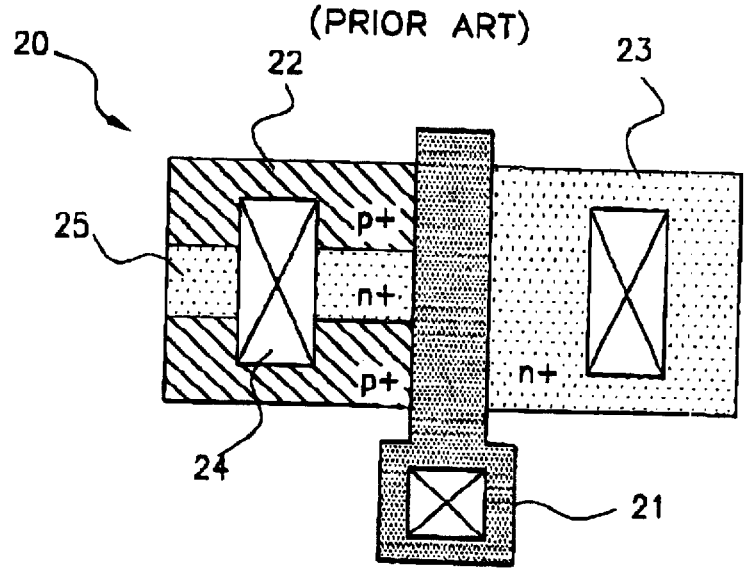
Figure 3A:
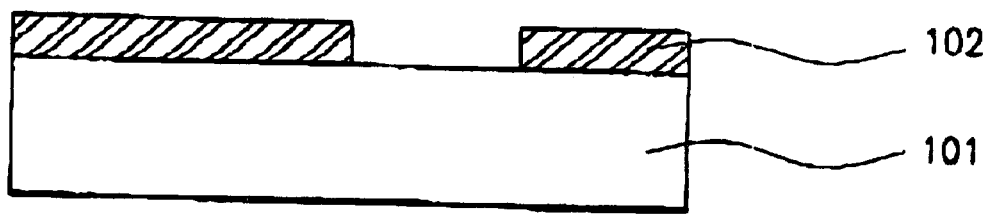
FIGS. 3A to 3F are cross-sectional views for describing a method of fabricating a SOI device according to an embodiment of the present invention.
Figure 3B:
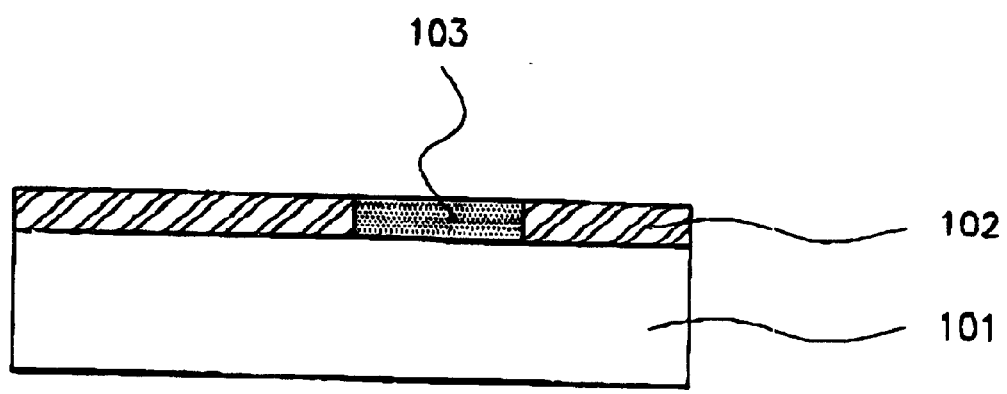
Figure 3C:
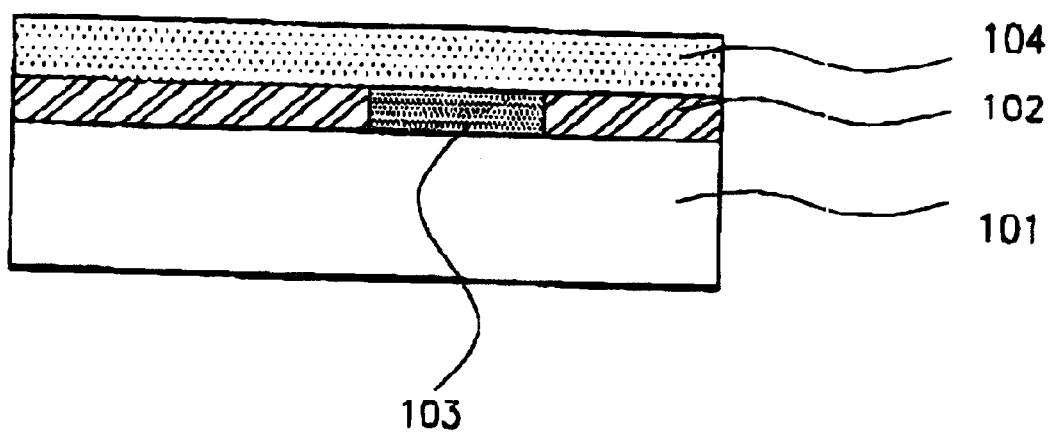
Figure 3D:
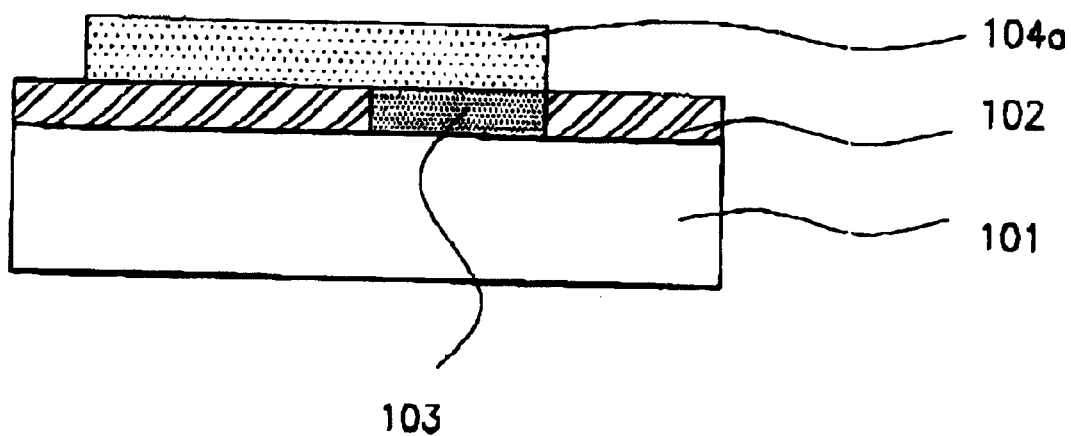
Figure 3E:
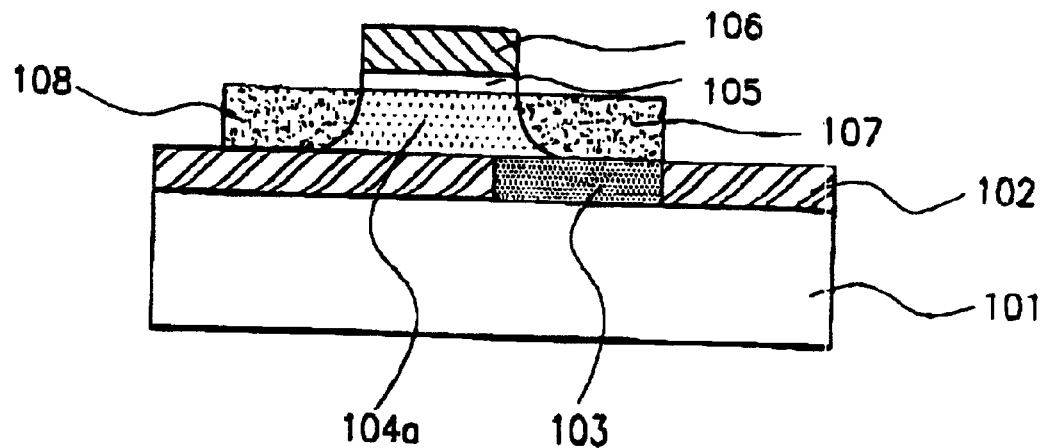
Figure 3F:
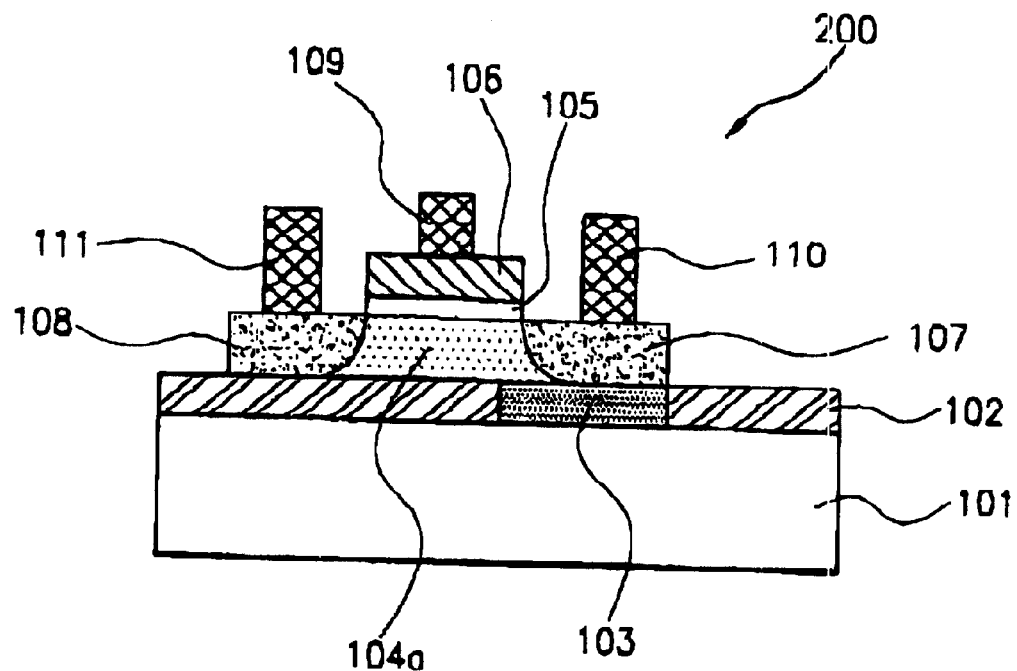

FIG. 3F is a cross-sectional view showing a SOI device 200 according to an embodiment of the present invention. As shown, the SOI device 200 of the present invention has a structure that a body layer 104a and a source region 107 in contact with a base substrate 101 by a body contact layer 103. Consequently, in the SOI device 200 of the present invention, the body layer 104a and the base substrate 101 are not insulated by a buried oxide layer 102, thereby removing a floating body effect. Static electricity concentrated in the body layer 104a is easily dissipated into the base substrate 101, thereby improving the ESD characteristics of the device. Accordingly, the SOI device 200 of the present invention operates in a stable state.

The method of fabricating the above-mentioned SOI device according to the present invention will be described with reference to FIGS. 3A to 3F.

FIG. 3A shows preparation of the base substrate 101. The buried oxide layer 102 is formed to the thickness of more than 50 Å, preferably 50~1,000 Å, on the base substrate 101. The buried oxide layer is then etched to expose a predetermined portion of the base substrate 101. It is preferable that the buried oxide layer 102 is made of a linear oxide layer or a thermal oxide layer to keep its good characteristic after etching. It is preferable that the buried oxide layer is etched by either a dry etching method or a wet etching method or by a combination of both etching methods. Herein, the exposed region of the base substrate 101 can subsequently contact the body and source regions, and is preferably wider than the channel region of the device.

FIG. 3B, the body contact layer 103 is formed to the same thickness as the buried oxide layer 102 on the exposed base substrate region. The body contact layer 103 is formed by growing a Si epitaxial layer to the same thickness as the buried oxide layer 102 on the exposed base substrate region using a selective epitaxial growth. Alternatively, the body contact layer 103 may be formed by growing the Si epitaxial layer on both the exposed base substrate region and the buried oxide layer 102, using the Si epitaxial growth and then etching back the Si epitaxial layer.

In FIG. 3C, the semiconductor layer 104 is formed to the thickness of more than 500 Å, preferably 500~1,000 Å, on the buried oxide layer 102 and the body contact layer 103. The semiconductor layer 104 may be formed by growing the Si epitaxial layer using the Si epitaxial growth and in the next step etching back the Si epitaxial layer. The semiconductor layer 104 and the body contact layer 103 may also be formed simultaneously. In this case, the Si epitaxial layer is formed on the exposed base substrate region and the buried oxide layer 101 and in the next step the surface of the Si epitaxial layer is planarized by a chemical mechanical polishing (CMP) thereby forming the semiconductor layer 104 and the body contact layer 103.

As shown in FIG. 3D, the semiconductor layer is etched, thereby forming the body layer 104a of a MOSFET. It is preferred that the body layer 104a be formed to contact a portion of the predetermined source region. This will permit the subsequently formed source regions to contact the body contact layer 103.

In FIG. 3E, a gate 106 having a gate oxide layer 105 is formed on the body layer 104a. The gate 106 may be a polysilicon layer, a metal layer, or a stack structure of a polysilicon layer and a metal or metallicized layer. A source region 107 and a drain region 108 are formed in the body layer 104a at both side of the gate 106 to a depth sufficient to contact the buried oxide layer 102. Herein, the source region 107 contacts both the body contact layer 103 and the base substrate 101 through the body contact layer 103.

As shown in FIG. 3F, a gate electrode 109, a source electrode 110, and a drain electrode 111 are formed through a metal wiring process to contact, respectively, with the gate 106, the source region 107, and the drain region 108.

The SOI device of the present invention fabricated through the above processes has a structure where the body layer 104a and the source region 107 contact with the base substrate 101 through the body contact layer 103.

As a result of this contact, the potential of the source and the body remain essentially equal, thereby dissipating holes flowed into the body layer through the source. Therefore, generation of a floating body effect, such as a kink effect, and the formation of a parasitic vertical type bipolar operation are suppressed. Similarly, the heat in the body generated due to static electricity is easily emitted through the base substrate, thereby improving the ESD characteristics of the device.

Figure 4:
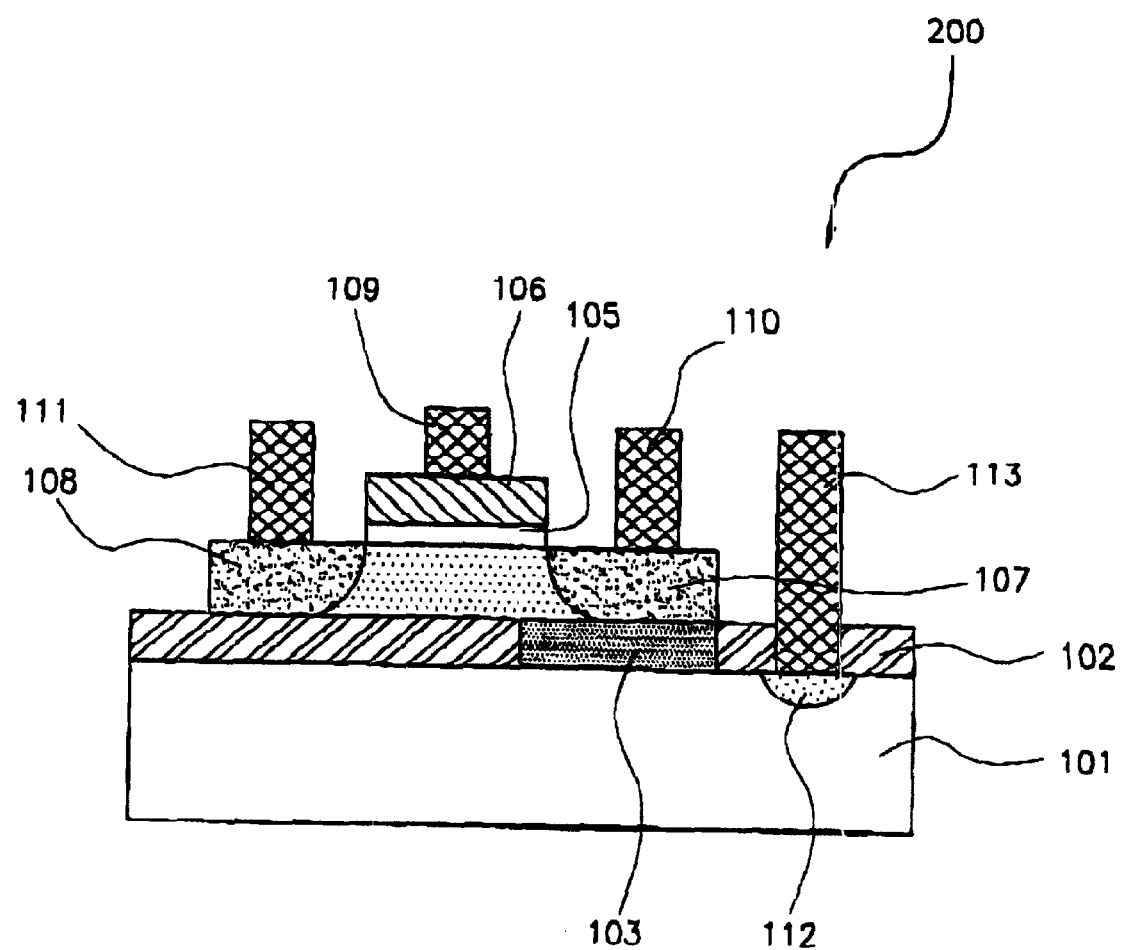
FIG. 4 is a cross-sectional view showing a SOI device according to the other embodiment of the present invention.

As another embodiment, as shown in FIG. 4, an impurity region 112 and a substrate contact electrode 113 may also be formed. The impurity region 112 may be formed by ion-implanting a predetermined conductive type impurity into a portion of the base substrate region exposed by etching the buried oxide layer 102. It is preferable that the substrate contact electrode 113 be formed during the metal wiring process.

A back bias voltage may then be applied via the substrate contact electrode 113 is applied to the SOI device 200 having the substrate contact electrode 113, to thereby improve design margin and threshold voltage characteristics of the MOSFET.

As described above, the SOI device of the present invention has a body contact layer so that the body and the base substrate, the source region and the base substrate are in contact with each other, thereby removing the floating body effect such as the kink effect and the parasitic vertical type bipolar operation and thus improving the ESD characteristic. The present invention, therefore, improves both the reliability and the operational stability of the device.

Various other modifications will be apparent to and can be readily made by those skilled in the art without departing from the scope and spirit of the present invention.

What is claimed is:

1. A SOI device comprising:

a base substrate;

a buried oxide layer formed to expose a predetermined region of the base substrate on the base substrate;

a body contact layer formed to the same thickness as the buried oxide layer on the exposed base substrate region;

a body layer of a transistor formed on the buried oxide layer and the body contact layer;

a gate having a gate oxide layer formed on the body layer; and a drain region and a source region respectively formed in a depth contacting with the buried oxide in the body layer region at both sides of the gate, the source being in contact with the body contact layer.

2. The SOI device according to claim 1, wherein the body contact layer is a selective Si epitaxial growth layer.

3. The SOI device according to claim 1, wherein the body layer is a Si epitaxial growth layer.

4. The SOI device according to claim 1, wherein the body contact layer and the body layer are a single Si epitaxial growth layer.

5. The SOI device according to claim 1, further comprising a gate electrode, a source electrode, and a drain electrode respectively contacting with the gate, the source region, and the drain region.

6. The SOI device according to claim 5, further comprising a substrate contact electrode in contact with the base substrate through the buried oxide layer.

7. The SOI device according to claim 6, further comprising an impurity region formed at a border between the substrate contact electrode and the base substrate.

\* \* \* \* \*